(12) United States Patent
Tuncer et al.

(10) Patent No.: US 11,201,065 B2
(45) Date of Patent: Dec. 14, 2021

(54) TESTING SEMICONDUCTOR COMPONENTS

(71) Applicant: TEXAS INSTRUMENTS INCORPORATED, Dallas, TX (US)

(72) Inventors: Enis Tuncer, Dallas, TX (US); Byron Harry Gibbs, Ector, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 16/791,152

(22) Filed: Feb. 14, 2020

(65) Prior Publication Data

US 2021/0134610 A1 May 6, 2021

Related U.S. Application Data

(60) Provisional application No. 62/928,974, filed on Oct. 31, 2019.

(51) Int. Cl.
*H01L 21/56* (2006.01)
*H01L 21/687* (2006.01)

(52) U.S. Cl.
CPC ........... *H01L 21/56* (2013.01); *H01L 21/687* (2013.01)

(58) Field of Classification Search
CPC ....... H01L 21/687; H01L 22/14; H01L 21/56; H01L 23/3107
See application file for complete search history.

(56) References Cited

U.S. PATENT DOCUMENTS

| | | | |
|---|---|---|---|
| 5,698,899 A * | 12/1997 | Hirakawa | ............. H01L 21/565 257/675 |
| 2002/0016894 A1* | 2/2002 | Takayasu | ............. G06K 19/073 711/163 |
| 2005/0199875 A1 | 9/2005 | Umemura et al. | |
| 2007/0052379 A1* | 3/2007 | Suh | ......... H02P 27/08 318/400.26 |
| 2009/0191702 A1 | 7/2009 | Nishimura et al. | |
| 2015/0084051 A1 | 3/2015 | Kubo et al. | |
| 2018/0109249 A1* | 4/2018 | Suh | .................. H01L 23/49503 |

OTHER PUBLICATIONS

PCT Search Report dated Feb. 4, 2021.

* cited by examiner

*Primary Examiner* — Dung A. Le
(74) *Attorney, Agent, or Firm* — Ronald O. Neerings; Charles A. Brill; Frank D. Cimino

(57) ABSTRACT

A method of manufacturing a semiconductor package includes covering a semiconductor die and a plurality of conductive terminals coupled to the semiconductor die in a mold compound, positioning the mold compound between a first pair of electrodes and a second pair of electrodes, and moving a movable electrode of the first pair and a movable electrode of the second pair into a first clamping position. In the first clamping position, each of the first pair of electrodes and the second pair of electrodes electrically couples to a unique subset of the plurality of conductive terminals. The method also includes applying, by the first pair of electrodes, a first voltage to the semiconductor die within the mold compound; and applying, by the second pair of electrodes, a second voltage to the semiconductor die within the mold compound. The second voltage is less than the first voltage.

15 Claims, 11 Drawing Sheets

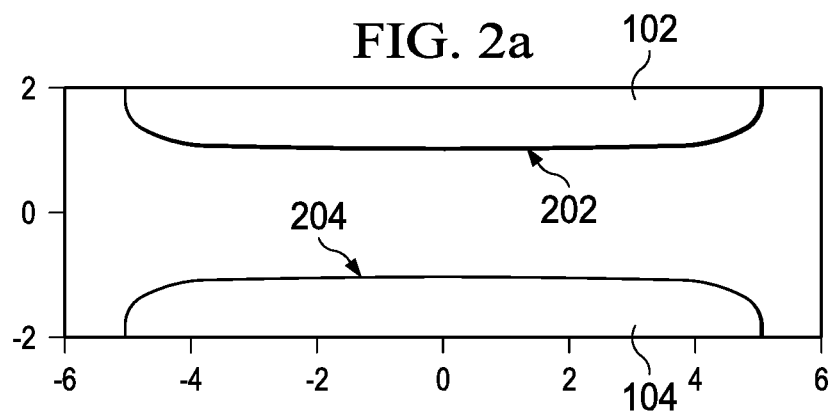
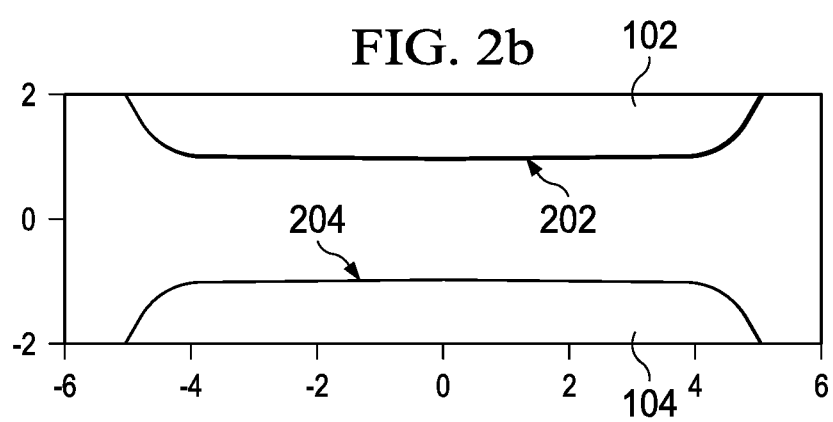
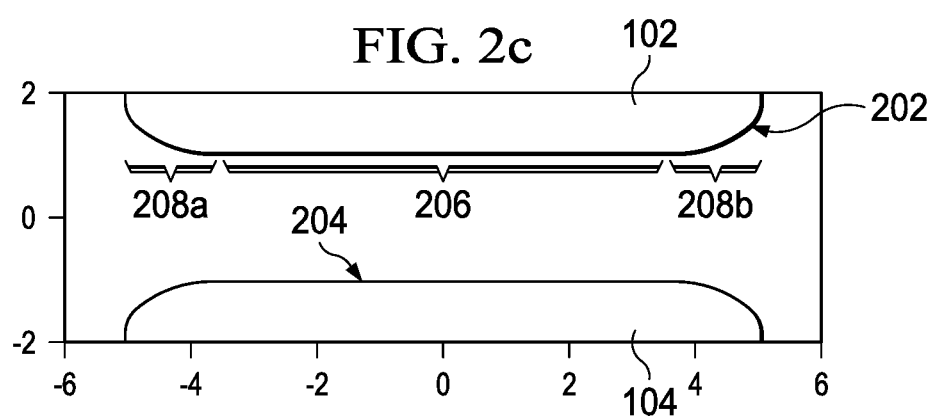

TESTING SEMICONDUCTOR COMPONENTS

CROSS-REFERENCE TO RELATED APPLICATIONS

The present application claims priority to U.S. Provisional Patent Application No. 62/928,974, which was filed Oct. 31, 2019, is titled "TESTING SEMICONDUCTOR COMPONENTS," and is hereby incorporated herein by reference in its entirety.

SUMMARY

In accordance with at least one example of the disclosure, a method of manufacturing a semiconductor package includes covering a semiconductor die and a plurality of conductive terminals coupled to the semiconductor die in a mold compound, positioning the mold compound between a first pair of electrodes and a second pair of electrodes, and moving a movable electrode of the first pair and a movable electrode of the second pair into a first clamping position. In the first clamping position, each of the first pair of electrodes and the second pair of electrodes electrically couples to a unique subset of the plurality of conductive terminals. The method also includes applying, by the first pair of electrodes, a first voltage to the semiconductor die within the mold compound; and applying, by the second pair of electrodes, a second voltage to the semiconductor die within the mold compound. The second voltage is less than the first voltage.

In accordance with another example of the disclosure, a system includes a first pair of electrodes and a second pair of electrodes configured to receive a semiconductor die and a plurality of conductive terminals coupled to the semiconductor die in a mold compound. Each of the first and second pairs of electrodes includes a movable electrode. The movable electrode of the first and second pairs of electrodes is configured to move between an open position and a clamping position, and in the clamping position each of the first pair of electrodes and the second pair of electrodes electrically couples to a unique subset of the first plurality of conductive terminals. The first pair of electrodes is configured to apply a first voltage to the semiconductor die within the mold compound, while the second pair of electrodes is configured to apply a second voltage to the semiconductor die within the mold compound. The second voltage is less than the first voltage.

BRIEF DESCRIPTION OF THE DRAWINGS

For a detailed description of various examples, reference will now be made to the accompanying drawings in which:

FIGS. 2a-2c show various cross-sectional views of electrodes of the system in FIGS. 1a-1d in accordance with various examples;

DETAILED DESCRIPTION

Figure 1A:
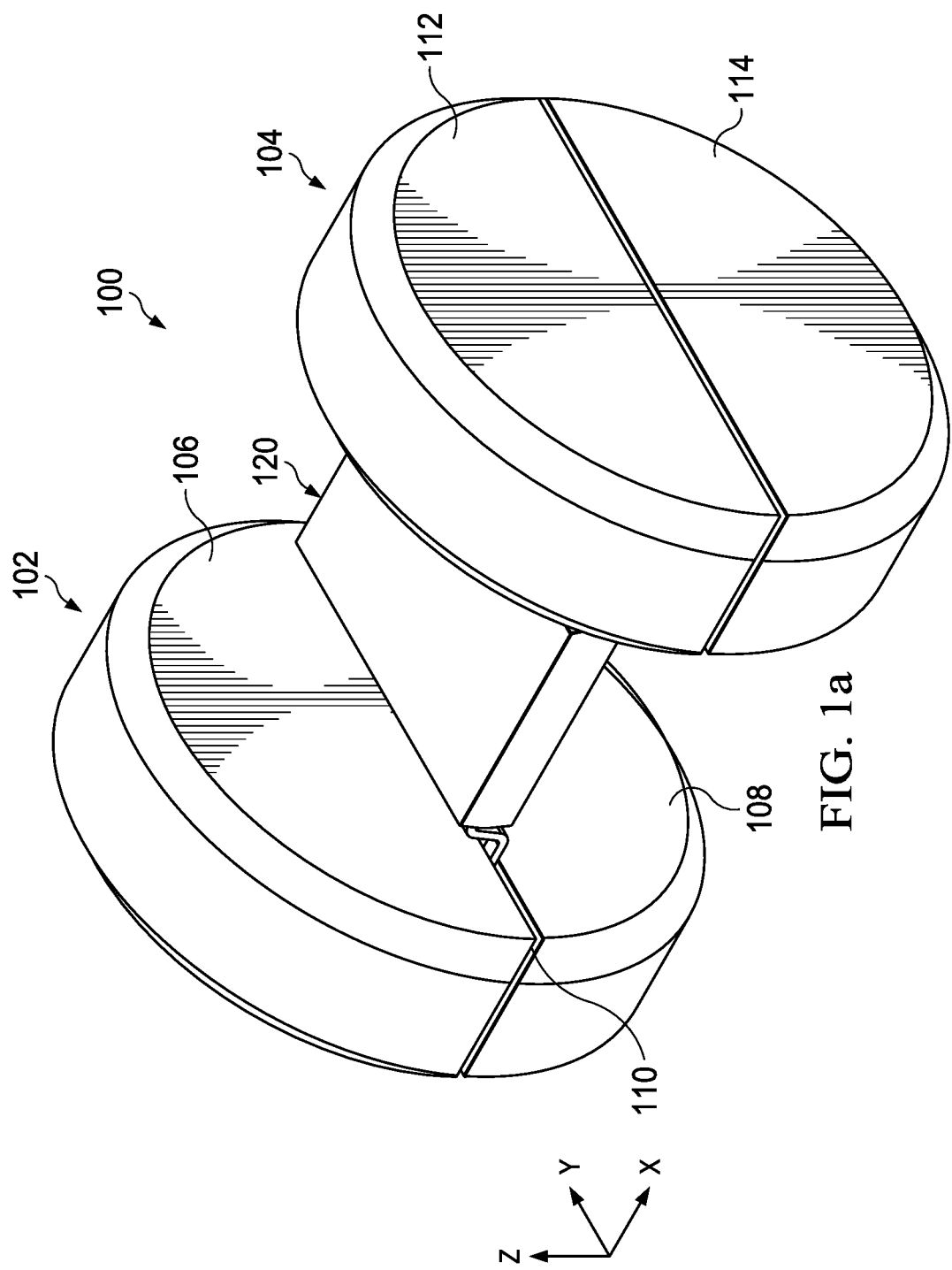
FIG. 1a shows a perspective view of a system for high voltage isolation testing of various devices during a manufacturing process for those devices in accordance with various examples.

Electrical circuits are formed on semiconductor dies and subsequently packaged inside moldings (e.g., epoxy) to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. The portions of the conductive terminals exposed to an external surface of a package are referred to as pins. By coupling the conductive terminals to electronics external to the package, a pathway is formed to exchange electrical signals between the electrical circuit within the package and the electronics external to the package via the conductive terminals.

Once a semiconductor die is packaged, the package is tested to ensure its compliance with various requirements. One such test is a high voltage isolation test, in which high voltage circuitry of the packaged device is isolated from low voltage circuitry of the packaged device. For example, a first group of pins of the packaged device are coupled to a high voltage circuit domain of the device while a second group of pins of the packaged device are coupled to a low voltage circuit domain of the device. The pins coupled to the high voltage domain are shorted together and coupled to a high voltage source, while the pins coupled to the low voltage domain are shorted together and coupled to a low voltage source or to a ground node. The high voltage isolation test confirms that a packaged device provides isolation between a low voltage circuit domain of the device and a high voltage circuit domain of the device, sufficient to satisfy a standard for the particular voltage level at which the packaged device will operate. In some examples, the high voltage isolation test applies a much higher voltage to the packaged device than the anticipated usage conditions of the packaged device, to further warrant reliability of the packaged device. In one example, a high voltage isolation test measures whether the packaged device can withstand a sufficiently high voltage without arcing. The high voltage isolation test also measures whether the partial discharge of the packaged device at a given applied voltage is less than a threshold amount.

Handler sockets used to perform high voltage isolation testing often include support structures formed from dielectric materials, which create undesirable electric field characteristics surrounding the packaged device under test (DUT). As a result, the achievable voltage for a high voltage test is limited and thus the DUT cannot be tested to its full potential due to charging of the dielectric support structures and the non-uniform electric field generated around the dielectric support structures. Further, while handheld devices exist to perform high voltage isolation testing with low, uniform electric fields surrounding the packaged DUT, these handheld devices are not conducive to automation or testing DUTs at typical production speeds.

This disclosure describes various examples of a method of manufacturing a packaged semiconductor device. The manufacturing method includes a testing process in which a high voltage isolation test is performed on the packaged device. The manufacturing method includes covering a semiconductor die and a plurality of conductive terminals in a mold compound (e.g., epoxy). The mold compound is then positioned between a first pair of electrodes and a second pair of electrodes, which are part of a system for high voltage isolation testing of various devices. The electrodes may be of various geometries as described further below.

During the testing process portion of the manufacturing method, a movable electrode of the first pair of electrodes and a movable electrode of the second pair of electrodes are moved into a clamping position, which causes electrical coupling between each of the first pair of electrodes and the second pair of electrodes and some of the conductive terminals. For example, in the clamping position, a first subset of the conductive terminals are electrically coupled to the first pair of electrodes, while a second subset, unique from the first subset, of the conductive terminals are electrically coupled to the second pair of electrodes. Once the first and second pairs of electrodes are in a clamping position, a first voltage is applied to the semiconductor die by the first pair of electrodes, while a second voltage is applied to the semiconductor die by the second pair of electrodes. The second voltage is lower than the first voltage and, in one example, the first voltage is in the range of 1-20 kV peak, and satisfies the requirements of a high voltage isolation test of the semiconductor die and mold compound during the manufacturing of the packaged semiconductor device. In an example, the second voltage is a voltage at a ground node. Additionally, as will be explained further below, the electrodes reduce the electric field surrounding the mold compound, or DUT, while increasing the uniformity of the electric field. Further, unlike dielectric support structures, the electrodes are not charged by the electric field and thus do not reduce the voltage able to be applied to the mold compound or DUT. As a result, the achievable voltage for a high voltage test is increased relative to a test handler socket composed of dielectric materials.

FIG. 1a depicts a system 100 for high voltage isolation testing of various devices during a manufacturing process for those devices in accordance with examples of this disclosure. The system 100 includes a first pair of electrodes 102 and a second pair of electrodes 104. Although the first and second pairs of electrodes 102, 104 are depicted as generally circular, embodiments of this disclosure are not limited to a particular geometry. In this example, the first pair of electrodes 102 is shown including an upper electrode 106 and a lower electrode 108, with a slot or space 110 formed there between. In an example, the second pair of electrodes 104 includes an upper electrode 112 and a lower electrode 114, which are substantially identical to the first pair of electrodes 102 including upper and lower electrodes 106, 108. At least one of the upper electrode 106 and the lower electrode 108 is movable relative to the other of the upper and lower electrodes 106, 108 (e.g., vertically or in the z-direction as shown in FIG. 1a). The movable one of the upper and lower electrodes 106, 108 may be referred to as a movable electrode, while the other of the upper and lower electrodes 106, 108 may be either movable or stationary. In one example, the lower electrode 108 remains stationary, and thus is a stationary electrode, while the upper electrode 106 is configured to move toward and away from the lower electrode 108 (e.g., in the z-direction notated in FIG. 1a), and thus is a movable electrode. In another example, the lower electrode 108 is the movable electrode while the upper electrode 106 is the stationary electrode. In yet another example, both the upper and lower electrodes 106, 108 are movable toward and away from one another in the z-direction. The second pair of electrodes 104 are configured for similar movement relative to one another as the first pair of electrodes 102 (e.g., in the z-direction). In yet other examples, one or both of the pairs of electrodes 102, 104 are additionally movable toward and/or away from each other (e.g., in the y-direction notated in FIG. 1a). As will be explained in further detail below, a semiconductor die and a plurality of conductive terminals coupled to the semiconductor die in a mold compound 120 may be positioned between the first pair of electrodes 102 and the second pair of electrodes 104 for high voltage isolation testing of the mold compound 120. For example, conductive terminals or pins of the mold compound are positioned in the slot or space 110 between the upper electrode 106 and the lower electrode 108 of the first pair of electrodes 102, and similarly for the second pair of electrodes 104.

Figure 1B:
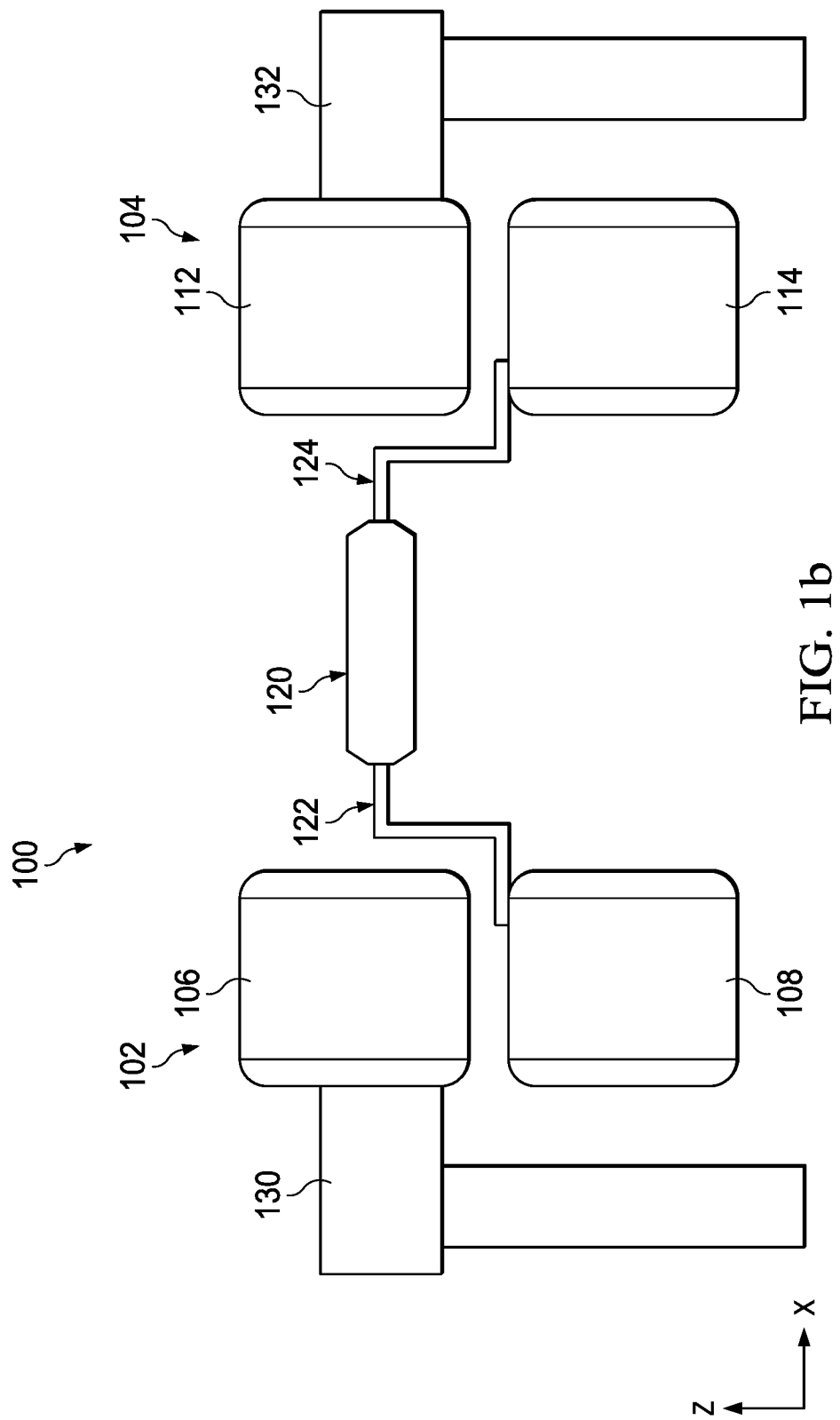
FIGS. 1b-1e show side views of a system for high voltage isolation testing of various devices during a manufacturing process for those devices in accordance with various examples.

FIG. 1b depicts a side view (e.g., along the y-direction) of the system 100 of FIG. 1a, including a semiconductor die and a plurality of conductive terminals coupled to the semiconductor die in a mold compound 120. The second pair of electrodes 104 includes an upper electrode 112 and a lower electrode 114, similar to the first pair of electrodes 102, as explained above. The mold compound 120 is positioned between the first pair of electrodes 102 and the second pair of electrodes 104. In this example, the conductive terminals of the mold compound 120 are depicted as pins 122, 124 that extend from the mold compound 120. The mold compound 120 is positioned such that a first set of pins 122 rest on the lower electrode 108 of the first pair of electrodes 102 while a second set of pins 124 rest on a lower electrode 114 of the second pair of electrodes 104. In the examples of this disclosure, the width of the mold compound 120 (including the pins) refers to the dimension of the mold compound 120 in the x-direction. The width of the mold compound 120 may vary, for example the mold compound 120 may be a narrow-body device, a wide-body device, or a device having a different width and/or thickness than standard narrow- or wide-body devices. Additionally, the height of the pins 122, 124 refers to the dimension of the conductive terminals of the mold compound 120 in the z-direction. The height of the pins 122, 124 may also vary.

For purposes of demonstration, in FIG. 1b, the first and second pairs of electrodes 102, 104 are in an open position. In the open position, one of the first pair of electrodes 102 (e.g., the upper electrode 106) is not in contact with the pins 122 of the mold compound 120. Similarly, one of the second pair of electrodes 104 (e.g., the upper electrode 112) is not in contact with the pins 124 of the mold compound 120. That is, the distance between the upper electrodes 106, 112 and the lower electrodes 108, 114 in the open position is greater than the height of the pins 122, 124. For example, with the pairs of electrodes 102, 104 in the open position, the mold compound 120 may be positioned with the pins 122, 124 resting on the upper-facing surface of the lower electrode 108, 114 while the pins 122, 124 are not in contact with the upper electrodes 106, 112.

Figure 1C:
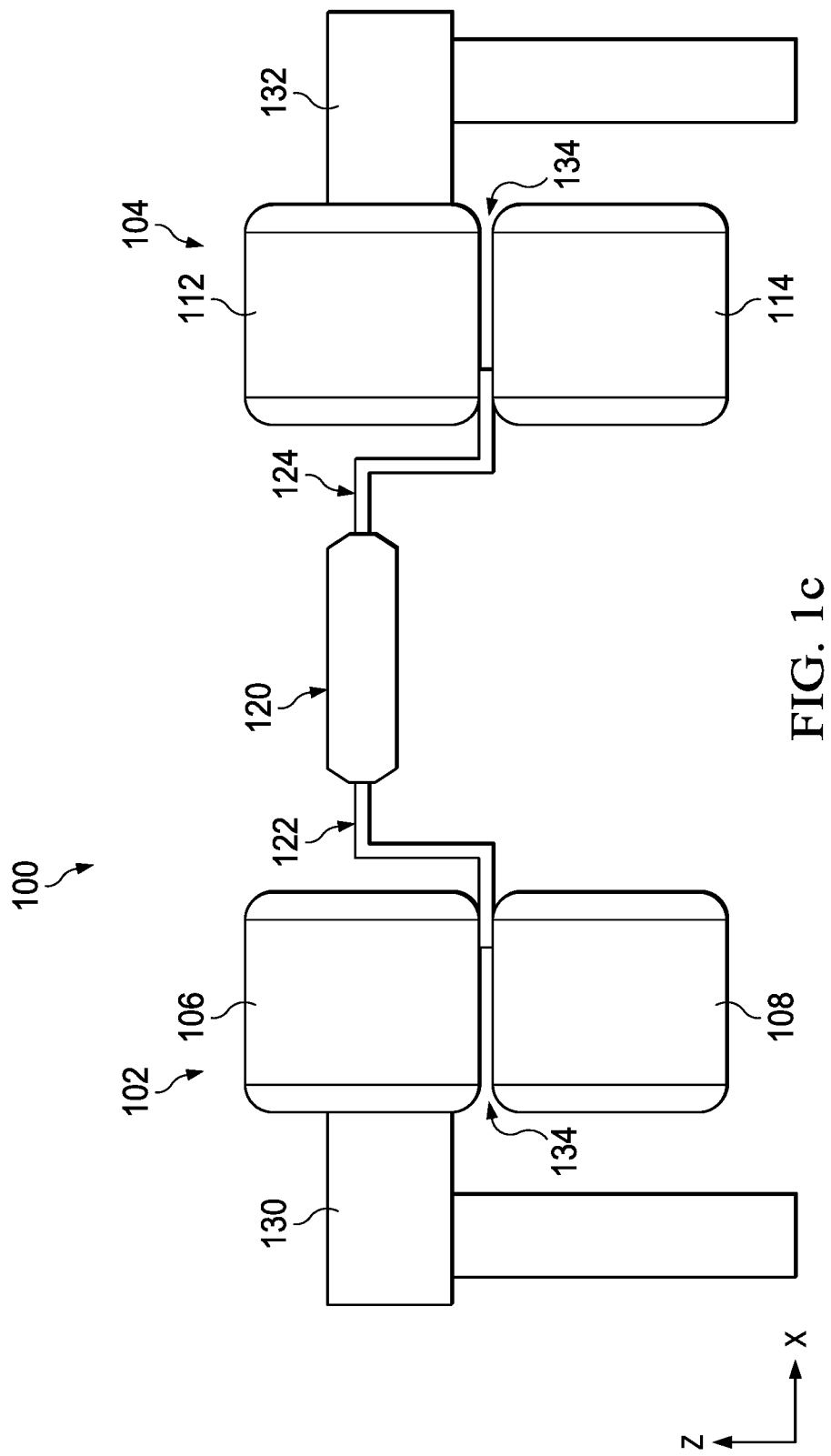

Turning to FIG. 1c, the first and second pairs of electrodes 102, 104 are in a clamping position. Once the mold compound 120 is placed on the lower electrodes 108, 114 as explained above, the movable electrodes (in this example, the upper electrodes 106, 112) move toward the stationary electrodes (in this example, the lower electrodes 108, 114) in the z-direction to a position such that the pins 122, 124 of the mold compound 120 are electrically coupled to the first pair of electrodes 102 and the second pair of electrodes 104, respectively. In particular, the pins 122 are electrically coupled to the upper electrode 106 and the lower electrode 108 of the first pair of electrodes 102 while the pins 124 are electrically coupled to the upper electrode 112 and the lower electrode 114 of the second pair of electrodes 104.

Referring to FIGS. 1b and 1c, a jig 130 is coupled to the upper electrode 106, while a jig 132 is coupled to the upper electrode 112. In one example, the jigs 130, 132 are substantially similar. The jigs 130, 132 facilitate the upper electrodes 106, 112 as movable electrodes. For example, although not depicted in FIGS. 1b and 1c, movement of the jigs 130, 132 (and thus the coupled upper electrodes 106, 112, respectively) may be facilitated by various well-understood structures, such as solenoids, electric motors, drivetrains, guiderails or guide tracks, and the like. In another example, the jigs 130, 132 are instead coupled to the lower electrodes 108, 114 while the upper electrodes 106, 112 are stationary. In yet another example where all electrodes are movable, jigs are coupled to both the lower electrodes 108, 114 and the upper electrodes 106, 112.

As explained above, since at least one of each of the first and second pairs of electrodes 102, 104 is movable in the z-direction, the system 100 is able to accommodate mold compounds 120 having pins or conductive terminals of varying heights or thicknesses by varying the position of the moving electrode(s) 106, 108, 112, 114 when in the clamping position. For example, where the lower electrodes 108, 114 are stationary as in the example of FIGS. 1b and 1c, while the upper electrodes 106, 112 move toward and away from the lower electrodes 108, 114, a mold compound 120 having thicker conductive terminals or pins is accommodated by increasing the distance between the upper electrodes 106, 112 and the lower electrodes 108, 114 when moving from an open position to a clamping position. Similarly, a mold compound 120 having less thick conductive terminals or pins is accommodated by decreasing the distance between the upper electrodes 106, 112 and the lower electrodes 108, 114 when moving from an open position to a clamping position. For example, referring to FIG. 1c, a distance 134 between the upper electrodes 106, 112 and the respective lower electrodes 108, 114 when in the clamping position varies depending on the height of the conductive terminals or pins of a particular mold compound 120. Thus, in an example, in a first clamping position, the distance 134 between the upper electrodes 106, 112 and the respective lower electrodes 108, 114 is a first value. Continuing this example, in a second clamping position, the distance 134 between the upper electrodes 106, 112 and the respective lower electrodes 108, 114 is a second value.

Once the first and second pairs of electrodes 102, 104 are in a clamping position, a first voltage is applied to the mold compound 120 by the first pair of electrodes 102, while a second voltage is applied to the mold compound 120 by the second pair of electrodes 104. The second voltage is lower than the first voltage and, in one example, the first voltage is in the range of 1-20 kV peak and satisfies the requirements of a high voltage isolation test of the mold compound 120 during the manufacturing of a packaged semiconductor device. In an example, the second voltage is a voltage at a ground node. Additionally, the first and second pairs of electrodes 102, 104 reduce the electric field surrounding the mold compound 120, or DUT, while increasing the uniformity of the electric field. In particular, in the clamping position the first and second pairs of electrodes 102, 104 contact the mold compound 120 along its sides (e.g., the sides containing the pins 122, 124), increasing the free space around the mold compound 120, which does not introduce electric field enhancements. As a result, the achievable voltage for a high voltage test is increased relative to a test handler socket composed of dielectric materials, which often occupy more area around an exemplary mold compound 120 or DUT and reduce the voltage able to be applied to the mold compound 120 or DUT.

After the first and second voltages are applied by the first and second pairs of electrodes 102, 104, respectively, the first and second pairs of electrodes 102, 104 are moved to an open position (e.g., as shown by the first and second pairs of electrodes 102, 104 in FIG. 1b) and the mold compound 120 is removed from between the first and second pairs of electrodes 102, 104. Subsequently, a second mold compound 120 may be placed between the first and second pairs of electrodes 102, 104 in the open position, and the process described with respect to FIGS. 1a-1c repeated with the second mold compound 120 (e.g., moving the movable electrode(s) of the first and second pairs of electrodes 102, 104 to a clamping position and applying first and second voltages to the second mold compound 120). The second mold compound 120 may have conductive terminals or pins of a different thickness than the first, original mold compound 120. In an example where the thickness of conductive terminals or pins of subsequent mold compounds 120 differs, the distance 134 between the upper electrodes 106, 112 and the lower electrodes 108, 114 in the clamping position may be adjusted from one mold compound 120 to the next, as explained above.

Figure 1D:
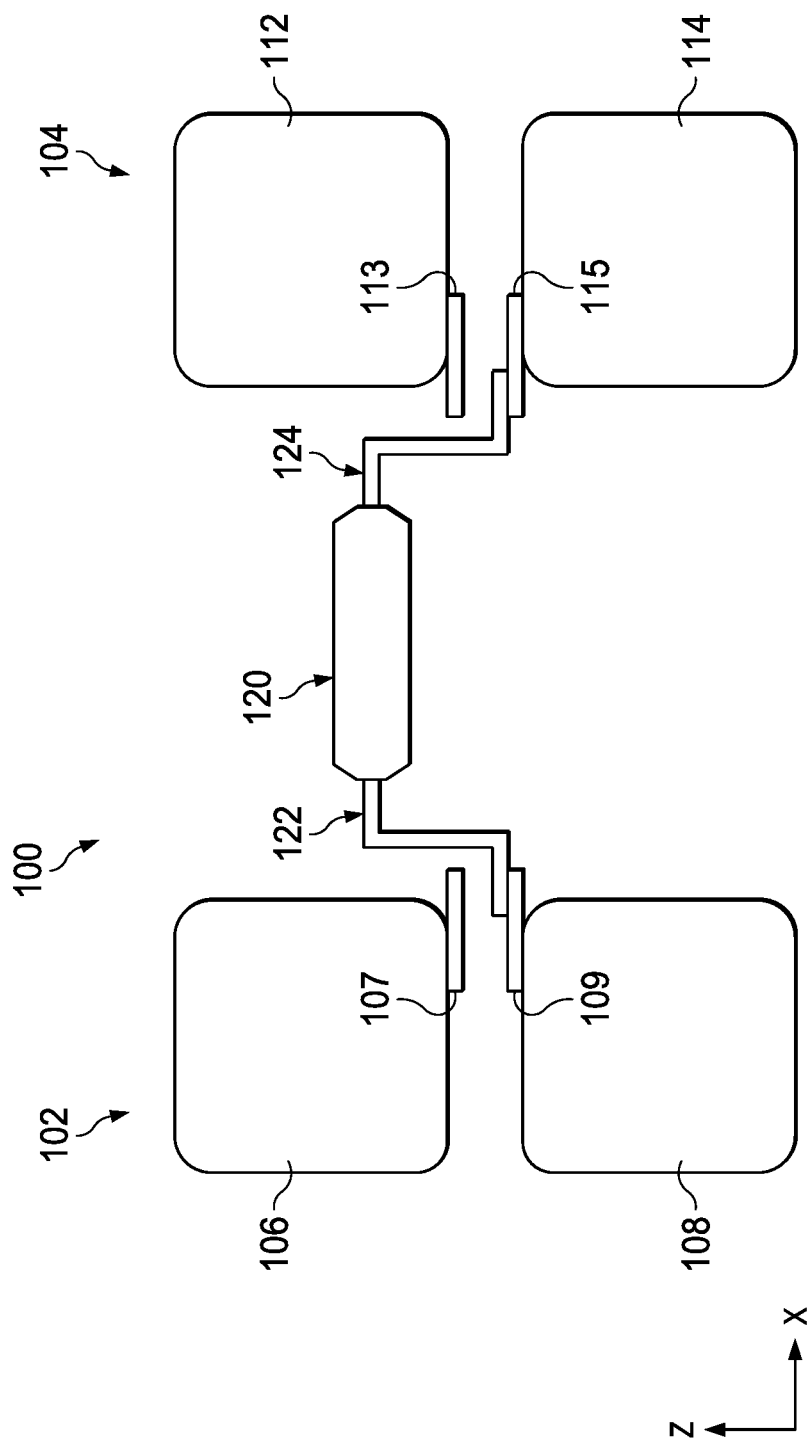
Figure 1E:
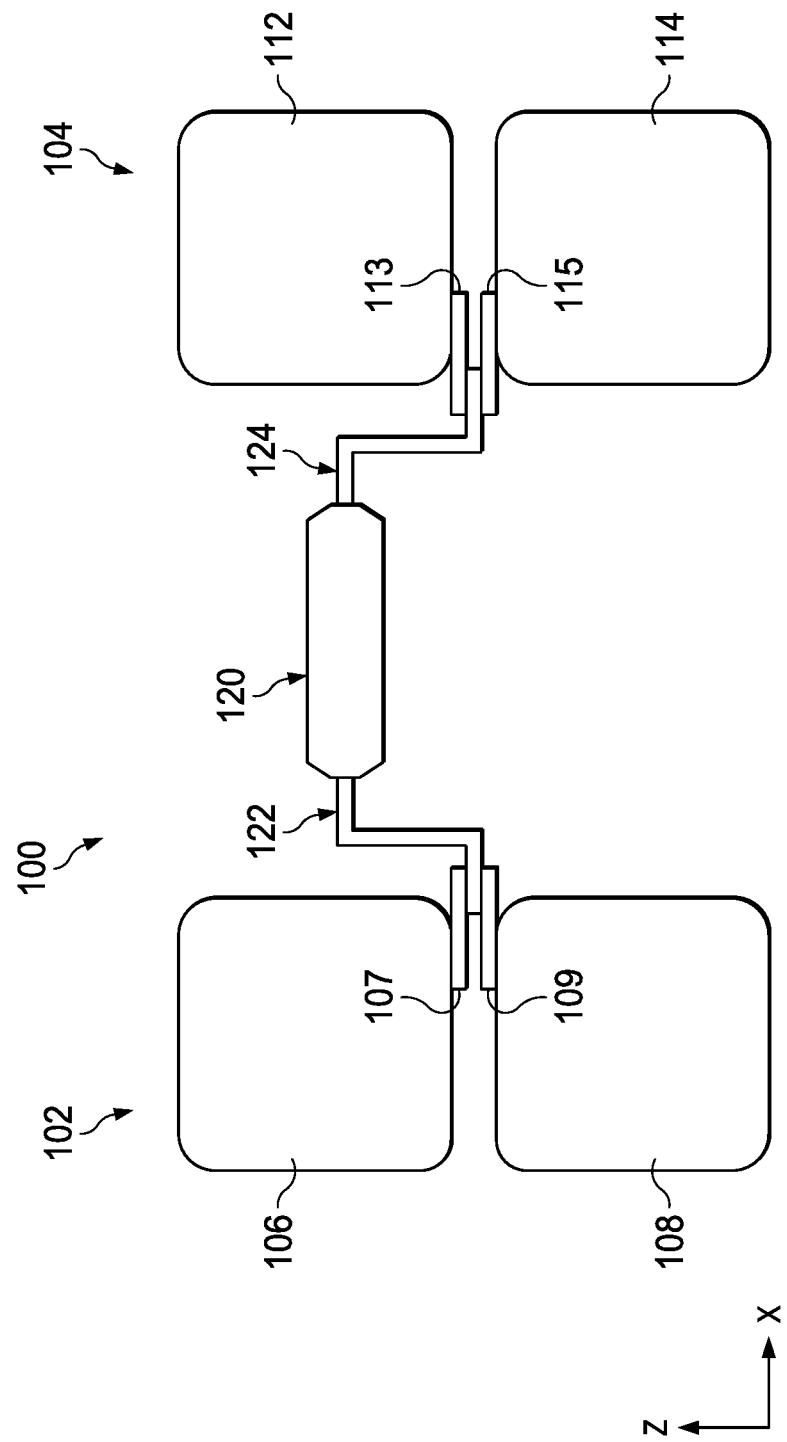

FIG. 1d shows an alternate example of the system 100, in which cantilever pins contact the pins 122, 124 of the mold compound 120 rather than the first and second pairs of electrodes 102, 104 themselves. However, for the purposes of this disclosure, the term "electrode" is not limited to a particular physical structure; rather "electrode" refers to both a physical structure (e.g., the first and second pairs of electrodes 102, 104) as well as any ancillary structure that is electrically coupled to such a physical structure. For example, in FIG. 1d, the cantilever pin 107 is coupled to the upper electrode 106; the cantilever pin 109 is coupled to the lower electrode 108; the cantilever pin 113 is coupled to the upper electrode 112; and the cantilever pin 115 is coupled to the lower electrode 114. Thus, in FIG. 1d, the cantilever pins 107, 109, 113, 115 are considered part of the electrodes 106, 108, 112, 114, respectively. Further, in FIG. 1d, the cantilever pins 107, 109, 113, 115 are in an open position, in which the cantilever pins 107, 113 do not contact the pins 122, 124, respectively. In FIG. 1e, the cantilever pins 107, 109, 113, 115 are in a clamping position, in which the cantilever pins 107, 113 are also in contact with the pins 122, 124, respectively.

In some examples, the system 100 of FIGS. 1a-1e also includes a pick-up head, for example that is part of a turret-type device handler. The pick-up head is configured to position a mold compound 120 between the first and second pairs of electrodes 102, 104, to move the mold compound 120 as needed (e.g., re-position), and to remove the mold compound 120 from between the first and second pairs of electrodes 102, 104 after testing of the mold compound 120 has been completed. In this way, the system 100 may be used for manufacturing a packaged semiconductor device with production-speed testing (e.g., using a turret-type device handler).

Figure 1F:
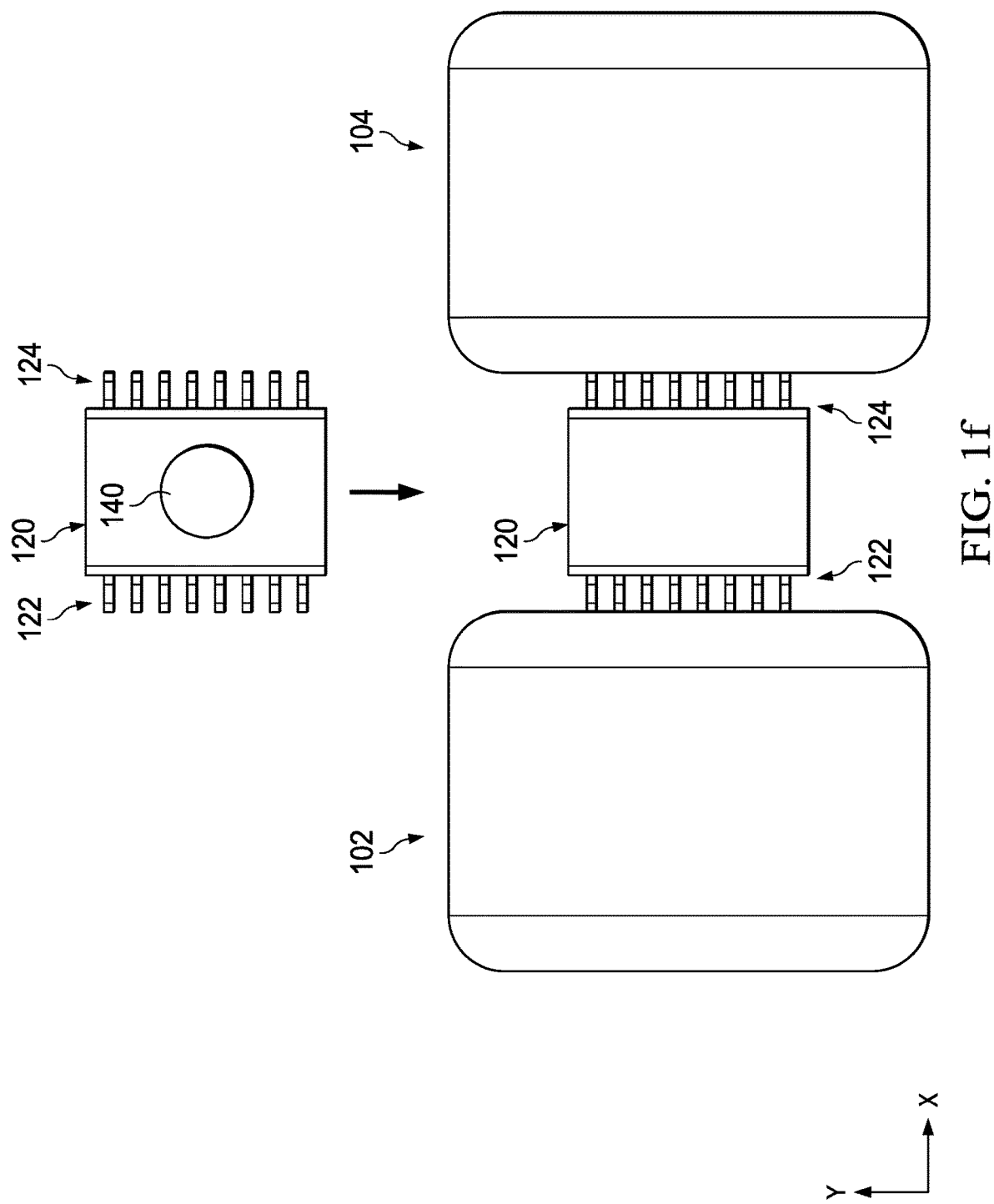
FIG. 1f shows a top view of a system for high voltage isolation testing of various devices during a manufacturing process for those devices in accordance with various examples.

FIG. 1f shows a top view of the system 100 of FIGS. 1a-1e (e.g., viewed along the z-direction), including a pick-up head 140, which in one example is part of a turret-type device handler used for moving and otherwise manipulating the mold compound 120. In examples, the pick-up head 140 is configured to grasp or otherwise fasten itself to the mold compound 120 (e.g., using suction) and manipulate the position of the mold compound 120. In these examples, the pick-up head 140 places the mold compound 120 between the first and second pairs of electrodes 102, 104. For example, the pins 122, 124 of the mold compound 120 rest on the lower electrodes 108, 114 of the first and second pairs of electrodes 102, 104, while the upper electrodes 106, 112 of the first and second pairs of electrodes 102, 104 do not contact the pins 122, 124. The pick-up head 140 may then release the mold compound 120 while the movable electrodes (e.g., the upper electrodes 106, 112 in the example of FIG. 1*b*) are moved into a clamping position. After a high voltage isolation test of the mold compound 120 is performed, the pick-up head 140 is configured to again grasp or otherwise fasten itself to the mold compound 120, for example to remove the mold compound 120 from between the first and second pairs of electrodes 102, 104 in preparation for manufacturing another semiconductor package.

FIG. 2*a* shows a top view of the first and second pairs of electrodes 102, 104 (e.g., viewed along the z-direction of FIGS. 1*a*-1*c*). In the example of FIG. 2*a*, the first pair of electrodes 102 includes an inner face 202, while the second pair of electrodes 104 includes an inner face 204. The inner faces 202, 204 face toward each other and, although not shown in FIG. 2*a*, it should be understood that the mold compound 120 is placed between the inner faces 202, 204 for high voltage isolation testing, as explained above. In FIG. 2*a*, a top-view profile of the inner face 202 of the first pair of electrodes 102 and the inner face 204 of the second pair of electrodes 104 is a Borda profile. As a result of the profile of the inner faces 202, 204 being a Borda profile, a uniform electric field is generated between two facing electrodes, such as the first and second pairs of electrodes 102, 104.

FIG. 2*b* shows another top view of the first and second pairs of electrodes 102, 104 (e.g., viewed along the z-direction of FIGS. 1*a*-1*c*). In the example of FIG. 2*b*, the first pair of electrodes 102 includes an inner face 202, while the second pair of electrodes 104 includes an inner face 204. The inner faces 202, 204 face toward each other and, although not shown in FIG. 2*b*, it should be understood that the mold compound 120 is placed between the inner faces 202, 204 for high voltage isolation testing, as explained above. In FIG. 2*b*, a top-view profile of the inner face 202 of the first pair of electrodes 102 and the inner face 204 of the second pair of electrodes 104 is a Rogowski profile. As a result of the profile of the inner faces 202, 204 being a Rogowski profile, a uniform electric field is generated between two facing electrodes, such as the first and second pairs of electrodes 102, 104.

FIG. 2*c* shows yet another top view of the first and second pairs of electrodes 102, 104 (e.g., viewed along the z-direction of FIGS. 1*a*-1*c*). In the example of FIG. 2*c*, the first pair of electrodes 102 includes an inner face 202, while the second pair of electrodes 104 includes an inner face 204. The inner faces 202, 204 face toward each other and, although not shown in FIG. 2*c*, it should be understood that the mold compound 120 is placed between the inner faces 202, 204 for high voltage isolation testing, as explained above. In the example of FIG. 2*c*, the shape of each of the first and second pairs of electrodes 102, 104 is cylindrical or semi-cylindrical with the rounded portion facing inward toward the other pair of electrodes (e.g., the flat portion of the semi-cylinders faces outward). In FIG. 2*c*, a top-view profile of the inner face 202 of the first pair of electrodes 102 and the inner face 204 of the second pair of electrodes 104 is that of a cylinder or semi-cylinder having rounded edges. In one example, the profile of the inner faces 202, 204 is a curvilinear profile. For example, the profile of the inner face 202 includes a linear section 206 toward the middle of the inner face 202 and curved sections 208*a*, 208*b* toward the ends of the inner face 202. The inner face 204 has a similar profile. As a result of the profile of the contacting faces 108, 110 being a curvilinear profile, known electric field lines are generated around the mold compound 120 or DUT, which electric field can thus be controlled by altering the radius of the inner faces 202, 204 or in the curvilinear example, the radius of the curved sections 208*a*, 208*b*.

Figure 2D:
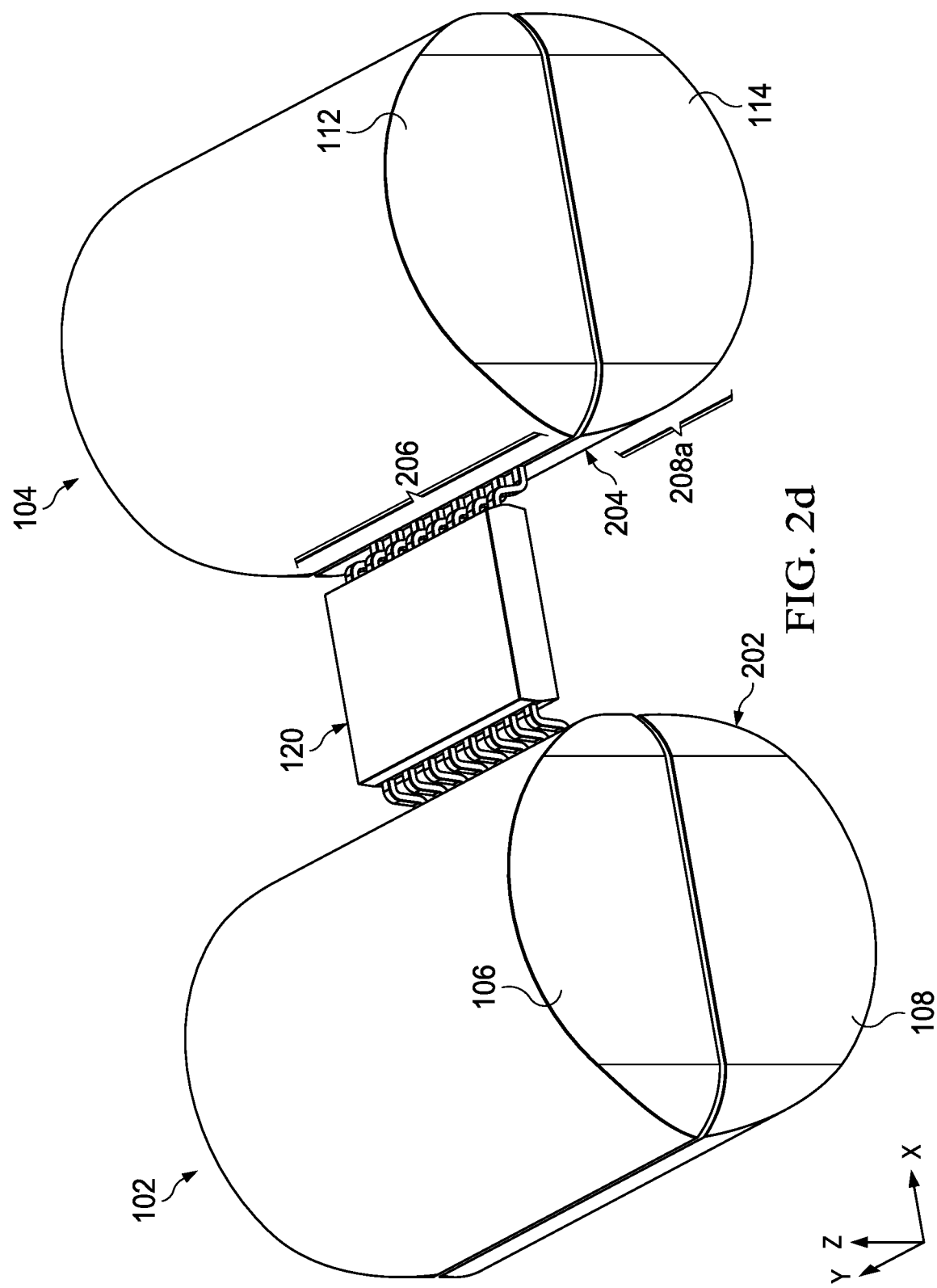
FIGS. 2d and 2e show additional perspective views of electrodes in accordance with various examples.

FIG. 2*d* shows another view of the first and second pairs of electrodes 102, 104, continuing the example of FIG. 2*c* in which the first and second pairs of electrodes 102, 104 are generally cylindrical, with the profile of the inner faces 202, 204 being a curvilinear profile. For example, a cross-section of the first and second pairs of electrodes 102, 104 taken in the y-direction is generally circular, while a cross-section of the first and second pairs of electrodes 102, 104 taken in the x-direction is generally rectangular. Further, as explained above with respect to FIG. 2*c*, the profile of the inner faces 202, 204 includes a linear section 206, in this case in the region of contact with the mold compound 120, in addition to a curved region 208*a* toward the edge of the inner faces 202, 204 (with a corresponding curved region at the other edge of the inner faces 202, 204, not shown in this view). In another example, the first and second pairs of electrodes 102, 104 are generally semi-cylindrical, with a rounded portion of the semi-cylinder facing toward the mold compound 120 and a flat portion of the semi-cylinder facing away from the mold compound 120.

Figure 2E:
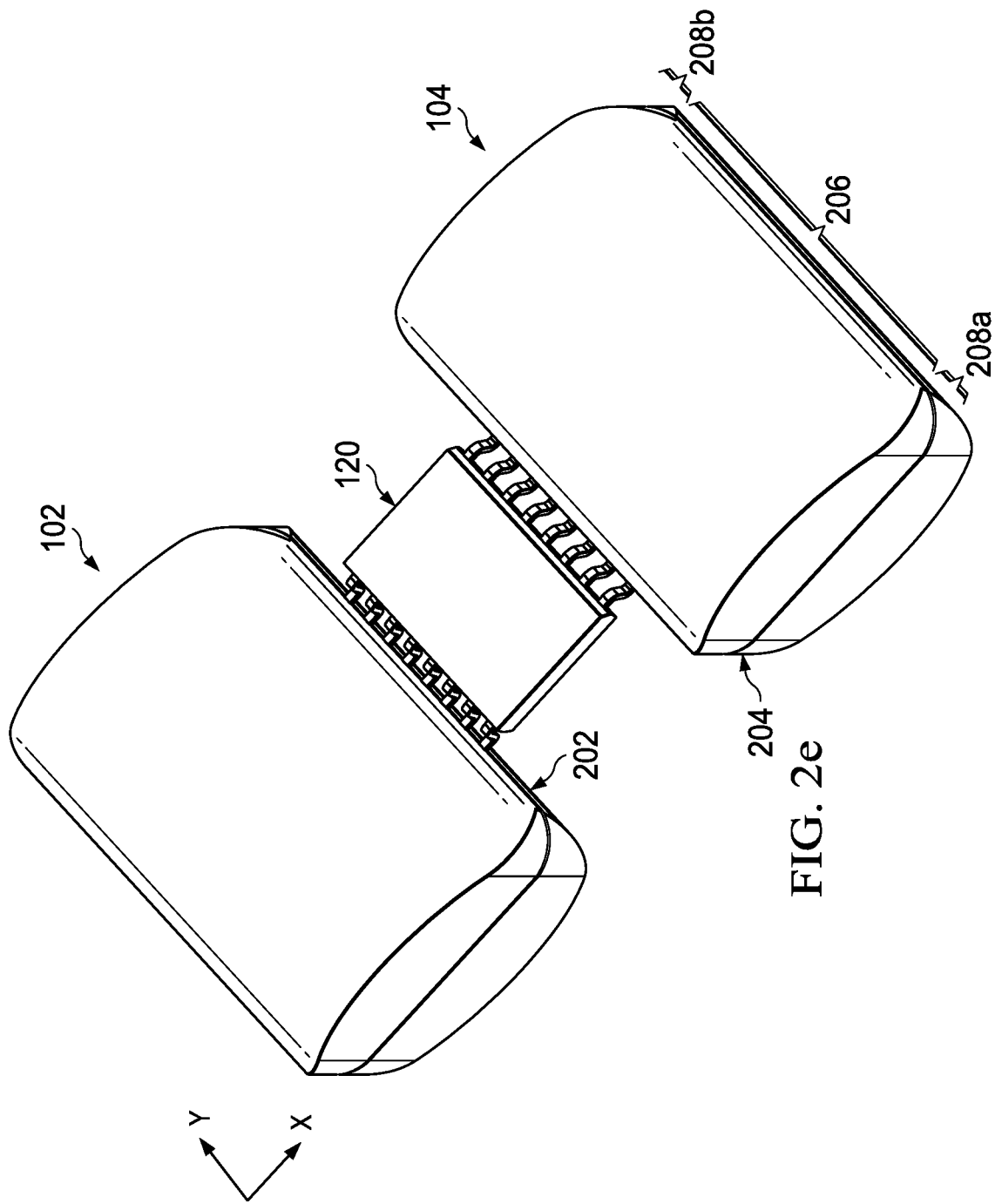

FIG. 2*e* shows another view of the example of FIG. 2*d*, which further emphasizes the curvilinear profile of inner faces 202, 204. For example, the inner face 202 profile of the first pair of electrodes 102 includes a linear section 206, in this case in the region of contact with the mold compound 120, in addition to a curved regions 208*a*, 208*b* toward the edges of the inner faces 202. The inner face 204 profile of the second pair of electrodes 104 is similar.

Figure 3A:
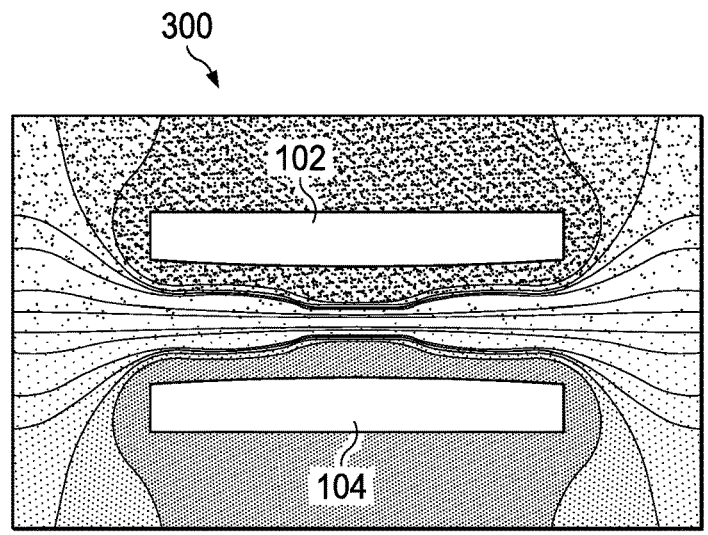
FIGS. 3a-3c show exemplary electric fields associated with the system in FIGS. 1a-1d in accordance with various examples.

FIG. 3*a* shows a top view (e.g., from the z-direction of FIGS. 1*a*-1*e*) of an exemplary electrical field 300 surrounding the first and second pairs of electrodes 102, 104. Notably, the electrical field 300 is relatively uniform surrounding the first and second pairs of electrodes 102, 104.

Figure 3B:
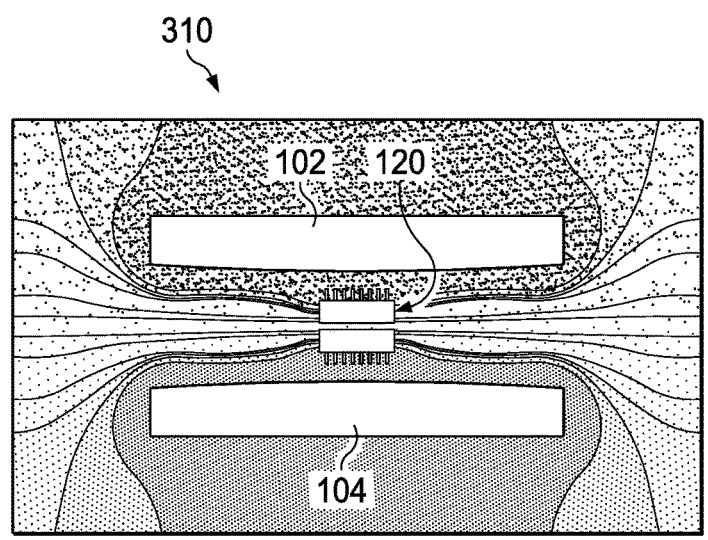

FIG. 3*b* also shows a top view (e.g., from the z-direction of FIGS. 1*a*-1*e*) of an exemplary electrical field 310 surrounding the first and second pairs of electrodes 102, 104 where a mold compound 120 has been positioned between the first and second pairs of electrodes 102, 104. Notably, the electrical field 310 is relatively uniform surrounding the electrodes 102, 104 and also relatively low on the electrodes 102, 104 and the mold compound 120 itself.

Figure 3C:
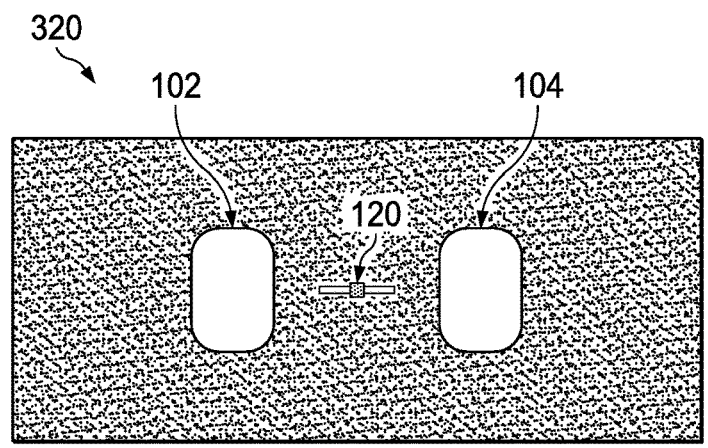

FIG. 3*c* shows a side view (e.g., from the y-direction of FIGS. 1*a*-1*e*) of an exemplary electrical field 320 surrounding the first and second pairs of electrodes 102, 104 where a mold compound 120 has been positioned between the first and second pairs of electrodes 102, 104. Notably, the electrical field 320 is concentrated around the mold compound 120, rather than the edges of supporting structures and other dielectric interfaces. For example, the electrical field 320 is not concentrated around the first and second pairs of electrodes 102, 104.

Figure 4:
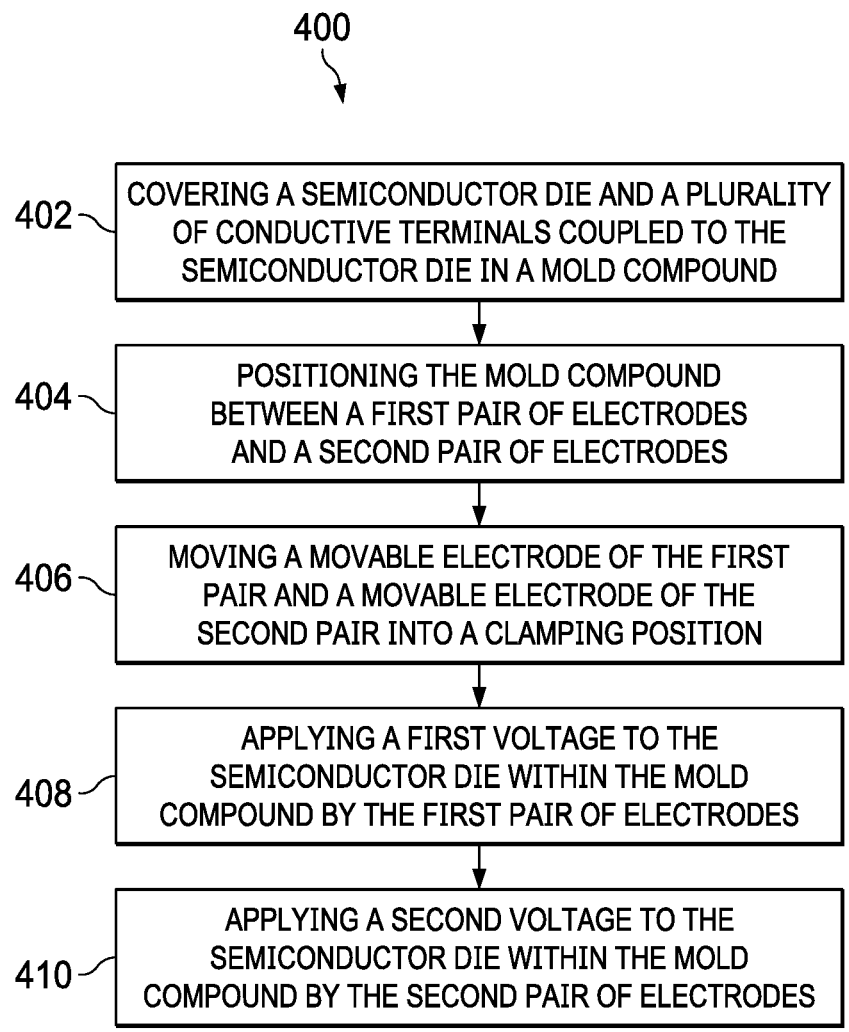
FIG. 4 shows a flow chart of a method for manufacturing a semiconductor package in accordance with various examples.

FIG. 4 shows a flow chart of a method 400 for manufacturing a semiconductor package in accordance with examples of this disclosure. The method 400 begins in block 402 with covering a semiconductor die and a plurality of conductive terminals coupled to the semiconductor die in a mold compound. At this stage of the manufacturing process, the mold compound 120 explained above is produced. The method 400 continues in block 404 with positioning the mold compound 120 between a first pair of electrodes and a second pair of electrodes (e.g., the first and second pairs of electrodes 102, 104 explained above). In an example, the positioning is effected by a pick-up head 140, which may be part of a turret-type device handler. During positioning of the mold compound 120, the first and second pairs of electrodes 102, 104 are in an open position, in which at least one of the first pair of electrodes 102 and one of the second pairs of electrodes 104 is not in contact with the mold compound 120, for example the pins 122, 124 of the mold compound 120. That is, the distance between the upper electrodes 106, 112 and the lower electrodes 108, 114 in the open position is greater than the height or thickness of the pins 122, 124 of the mold compound 120. For example, with the first and second pairs of electrodes 102, 104 in the open position, the mold compound 120 may be positioned with the pins 122 contacting the lower electrode 108, while the pins 124 are contacting the lower electrode 114. The pins 122, 124 do not contact the upper electrodes 106, 112 in the open position.

The method 400 continues in block 406 with moving a movable electrode of the first pair of electrodes 102 and a movable electrode of the second pair of electrodes 104 into a clamping position. In the clamping position, each of the first pair of electrodes 102 and the second pair of electrodes 104 is electrically coupled to some of the conductive terminals (e.g., pins 122, 124) of the mold compound 120. For example, in the clamping position, a first subset of the conductive terminals (e.g., pins 122) are electrically coupled to the first pair of electrodes 102, while a second subset, unique from the first subset, of the conductive terminals (e.g., pins 124) are electrically coupled to the second pair of electrodes 104.

The method 400 then continues in block 408 with applying a first voltage to the semiconductor die within the mold compound 120 by the first pair of electrodes 102. The method 400 further continues in block 410 with applying a second voltage to the semiconductor die within the mold compound 120 by the second pair of electrodes 104. The second voltage is lower than the first voltage and, in one example, the first voltage is in the range of 1-20 kV peak, and satisfies the requirements of a high voltage isolation test of the semiconductor die and mold compound during the manufacturing of the packaged semiconductor device. In an example, the second voltage is a voltage at a ground node.

After applying the first and second voltages in blocks 408, 410, the method 400 may optionally continue with moving the first and second pairs of electrodes 102, 104 back into an open position and removing the first mold compound 120 from the lower electrodes 108, 114 (e.g., again using the pick-up head 140). The method 400 may then be repeated with subsequent semiconductor dies in mold compounds 120. In some examples, the mold compounds 120 manufactured according to the method 400 may have different widths and/or heights or thickness of conductive terminals. For mold compounds 120 having different widths, the space between the first and second pairs of electrodes (e.g., in the x-direction) may be modified. Additionally or alternately, for mold compounds 120 having different height or thickness of conductive terminals, the distance 134 between the upper electrodes 106, 112 and the lower electrodes 108, 114 in the clamping position may vary from one mold compound 120 to another mold compound 120.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method of manufacturing a semiconductor package, the method comprising:
   covering a first semiconductor die and a first plurality of conductive terminals coupled to the first semiconductor die in a first mold compound;
   positioning the first mold compound between a first pair of electrodes and a second pair of electrodes;
   moving a movable electrode of the first pair and a movable electrode of the second pair into a first clamping position, wherein in the first clamping position each of the first pair of electrodes and the second pair of electrodes electrically couples to a unique subset of the first plurality of conductive terminals;
   applying, by the first pair of electrodes, a first voltage to the first semiconductor die within the first mold compound; and
   applying, by the second pair of electrodes, a second voltage to the first semiconductor die within the first mold compound;
   wherein the second voltage is less than the first voltage.

2. The method of claim 1, wherein positioning further comprises positioning using a pick-up head of a turret-type device handler.

3. The method of claim 1, wherein moving further comprises moving the movable electrode of the first and second pairs of electrodes vertically.

4. The method of claim 1, further comprising:
after applying the first and second voltages, moving the movable electrode of the first and second pairs of electrodes into an open position, wherein in the open position at least one of each of the first and second pairs of electrodes is not in contact with the first plurality of conductive terminals; and
removing the first mold compound from the electrodes.

5. The method of claim 4, further comprising:
covering a second semiconductor die and a second plurality of conductive terminals coupled to the second semiconductor die in a second mold compound;
positioning the second mold compound between the first pair of electrodes and the second pair of electrodes;
moving the movable electrode of the first pair and the movable electrode of the second pair into a second clamping position, wherein in the second clamping position each of the first pair of electrodes and the second pair of electrodes electrically couples to a unique subset of the second plurality of conductive terminals;
applying, by the first pair of electrodes, a first voltage to the second semiconductor die within the second mold compound; and
applying, by the second pair of electrodes, a second voltage to the second semiconductor die within the second mold compound;
wherein the second voltage is less than the first voltage; and
wherein a height of the conductive terminals of the second mold compound is different than a height of the conductive terminals of the first mold compound.

6. The method of claim 5, wherein a distance between each of the first pair of electrodes and the second pair of electrodes in the first clamping position is different than a distance between each of the first pair of electrodes and the second pair of electrodes in the second clamping position.

7. The method of claim 1, wherein:
the first voltage is approximately equal to 1 to 20 kV; and
the second voltage is approximately equal to a voltage at a ground node.

8. A system, comprising:
a first pair of electrodes and a second pair of electrodes configured to receive a semiconductor die and a plurality of conductive terminals coupled to the semiconductor die in a mold compound, each of the first and second pairs of electrodes comprising a movable electrode;
wherein the movable electrode of the first and second pairs of electrodes is configured to move between an open position and a clamping position, wherein in the clamping position each of the first pair of electrodes and the second pair of electrodes electrically couples to a unique subset of the first plurality of conductive terminals;
wherein the first pair of electrodes is configured to apply a first voltage to the semiconductor die within the mold compound;
wherein the second pair of electrodes is configured to apply a second voltage to the semiconductor die within the mold compound; and
wherein the second voltage is less than the first voltage.

9. The system of claim 8, wherein:
the first pair of electrodes comprises an inner face facing the second pair of electrodes;
the second pair of electrodes comprises an inner face facing the first pair of electrodes; and
a profile of each inner face comprises a Borda profile.

10. The system of claim 8, wherein:
the first pair of electrodes comprises an inner face facing the second pair of electrodes;
the second pair of electrodes comprises an inner face facing the first pair of electrodes; and
a profile of each inner face comprises a Rogowski profile.

11. The system of claim 8, wherein:
the first pair of electrodes comprises an inner face facing the second pair of electrodes;
the second pair of electrodes comprises an inner face facing the first pair of electrodes; and
a profile of each inner face comprises a curvilinear profile.

12. The system of claim 8, wherein the movable electrode of the first and second pairs of electrodes is configured move vertically between the open position and the clamping position.

13. The system of claim 8, wherein:
the movable electrode of each of the first and second pairs of electrodes is configured to move between an open position and at least a first and second clamping position; and
a distance between each of the first pair of electrodes and the second pair of electrodes in the first clamping position is different than a distance between each of the first pair of electrodes and the second pair of electrodes in the second clamping position.

14. The system of claim 8, further comprising a turret-type device handler comprising a pick-up head configured to:
position the mold compound between the first and second pairs of electrodes; and
remove the mold compound from between the first and second pairs of electrodes.

15. The system of claim 8, wherein:
the first voltage is approximately equal to 1 to 20 kV; and
the second voltage is approximately equal to a voltage at a ground node.

* * * * *